US012640681B2

(12) United States Patent (10) Patent No.: US 12,640,681 B2

Singh et al. (45) Date of Patent: May 26, 2026

(54) CIRCUIT FOR PERFORMING EXPONENTIAL TEMPERATURE COMPENSATION IN AN OSCILLATOR

(71) Applicant: SAMSUNG ELECTRONICS CO., LTD., Suwon-si (KR)

(72) Inventors: Shubham Raj Singh, Suwon-si (KR); Subodh Prakash Taigor, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/978,742

(22) Filed: Dec. 12, 2024

(65) Prior Publication Data

US 2026/0058603 A1 Feb. 26, 2026

(30) Foreign Application Priority Data

Aug. 20, 2024 (IN) .............................. 202441062820

(51) Int. Cl.
*H03B 5/04* (2006.01)

(52) U.S. Cl.
CPC .................................... *H03B 5/04* (2013.01)

(58) Field of Classification Search
CPC ...................................................... H03B 5/04
USPC .......................................................... 331/66
See application file for complete search history.

(56) References Cited

U.S. PATENT DOCUMENTS

| 11,323,067 B2 | 5/2022 | Nakatani et al. | |
| 2003/0189859 A1* | 10/2003 | Takahashi | G11C 11/406 |
| | | | 365/200 |
| 2022/0345086 A1 | 10/2022 | Agarwal et al. | |
| 2023/0283265 A1* | 9/2023 | Wang | H03B 5/26 |
| | | | 331/111 |

FOREIGN PATENT DOCUMENTS

CN          103248319 B          4/2016

OTHER PUBLICATIONS

Cimbili, B. et al., "A PVT-tolerant relaxation oscillator in 65nm CMOS", 2016 IEEE Region 10 Conference (TENCON), Nov. 22-25, 2016, pp. 2315-2318. (5 pages total).

* cited by examiner

*Primary Examiner* — Joseph Chang

(74) *Attorney, Agent, or Firm* — Sughrue Mion, PLLC

(57) ABSTRACT

There is provided an error compensation circuit for eliminating temperature-based frequency error in an oscillator. The error compensation circuit includes a current limiting circuit including a first metal-oxide-semiconductor (MOS) device and a first resistive element connected to the first MOS device, a current generation circuit including a second MOS device and a second resistive element connected in series with the second MOS device, and a p-channel-metal-oxide-semiconductor (PMOS) current mirror configured to output the compensation current to a capacitor of the oscillator. The current limiting circuit is configured to turn off the first MOS device to provide zero compensation current at a first temperature lower than a first reference value, and the current generation circuit is configured to generate a compensation current at a second temperature higher than a second reference value.

10 Claims, 11 Drawing Sheets

VARIATION OF COMPARATOR DELAY OVER TEMPERATURE (TT)

CIRCUIT FOR PERFORMING EXPONENTIAL TEMPERATURE COMPENSATION IN AN OSCILLATOR

CROSS-REFERENCE TO RELATED APPLICATION

This application is based on and claims priority under 35 U.S.C. § 119 to Indian Patent Application number 202441062820, filed on Aug. 20, 2024, in the Indian Patent Office, the disclosure of which is incorporated by reference herein in its entirety.

TECHNICAL FIELD

Embodiments as disclosed herein relate to error compensation circuits, and more particularly to error compensation circuits for eliminating temperature-based frequency error in an oscillator.

BACKGROUND

Oscillators are electronic circuits designed to produce a periodic, oscillating or alternating current (AC) signal, based on a direct current (DC) source. The oscillators are often characterized by the frequency of their output signal. The oscillators are generally designed to have low frequency error over process, voltage, and temperature (PVT), or high linearity in the frequency with respect to temperature.

At high temperatures, occurrence of errors in the oscillator increases exponentially and a need for a suitable temperature compensation circuit arises. Hence, the related art approach does not provide a solution to the occurrence of error at higher temperatures, which generally occurs from a comparator part of the oscillator.

FIG. 1 is an example circuit diagram illustrating a resistance-capacitance (RC) relaxation oscillator. The resistor Rf can provide a comparator common mode voltage and a current source above the resistor Rf. Assuming, Q is set to 'one', QB is set to 'zero', capacitor C1 gets discharged, and capacitor C2 gets charged with the switch network, which is followed by the comparator decisions. The comparator S is set to 'zero' and the comparator R is set to 'one'. Therefore, SR operation results in Q being set to 'zero' and QB being set to 'one' for the next cycle, and hence, the capacitor C1 starts charging and, the capacitor C2 starts discharging. Therefore, based on the operations as illustrated in FIG. 1, the frequency of the oscillation is controlled by choosing resistor (Rf), the capacitors (C1 and C2), and the resistors (R1 and R2), where R1=R2=R; C1=C2=C. As the oscillation frequency depends on the resistor Rf, and capacitors C1 and C2, their variation across PVT needs to be trimmed off. Also, the scheme results in an oscillation period is of 2*(RC+ $t_{delay}$), whereas $t_{delay}$ is the delay of the comparator and the reset logic. In the related art mechanism, there are two major sources of temperature-based frequency error. The first source of temperature-based frequency error is the variation of the product resistance-capacitor (RC) based on the temperature and the second source of temperature-based frequency error is the delay profile of comparator based on the temperature. In modern technology nodes, active resistors have high positive temperature coefficients, which can decrease the frequency at higher temperature, whereas, a reduction in the comparator delay performs the exact opposite (i.e., increases the frequency at higher temperature). Therefore, the behavior of the frequency of the oscillation becomes worse at higher temperatures. Hence, an exponential correction circuit is needed.

FIG. 2 is an example graph diagram illustrating the variation of a comparator delay over the temperature. As illustrated in FIG. 2, the slope of the comparator delay over temperature decreases from 25 Celsius (C) and up, which causes the effect of RC increment to dominate. Hence, at higher temperatures, the frequency drift error effectively increases more. As illustrated in FIG. 2, the comparator delay leads to a 1 nano second (ns) of period drift based on the temperature. Therefore, it requires a higher compensation current at higher temperatures, and almost zero current at lower temperature regions.

FIG. 3 is an example circuit diagram illustrating a reference voltage and a reference current for performing comparator and biasing operations respectively. As illustrated in FIG. 3, a PVT insensitive reference voltage and a PVT insensitive reference current are generated. Also, a reference voltage (VREF) serves as the common mode of comparator and the reference current (IREF) can be used to bias the comparators, and to charge the capacitors C1 and C2. Hence, the effect of comparator delay and its variation over the temperature has been ignored. As a result, it takes a lot of trimming bits to trim VREF and IREF. Also, a separate trim is required to trim off the frequency variation of the oscillator.

FIG. 4 is an example circuit diagram illustrating the occurrences of error from the bias block and the comparator. As illustrated in FIG. 4, the reference voltage (VREF) from the reference generator can be used to bias the comparators and the reference current (IREF) can be used to charge the capacitors C1 and C2, which provides error from the bias block to the comparator.

FIG. 5 is an example graph diagram illustrating a comparator delay with respect to the temperature for constant IBIAS. As illustrated in FIG. 5, at constant IBIAS, the comparator delay (Δtpd) at the temperature between 27 degree Celsius (C) to 135 degree Celsius (C) is 0.7 nano seconds (ns).

Also, the time period of oscillation for the circuit as illustrated in FIG. 4, can be expressed as, $$T_{OSC} = 2 * \left( V_{REF} * \frac{C}{I_{REF}} + tpd_{Comparator} \right)$$

Also, assuming 0.1% of PVT error (after trimming) from VREF and $I_{REF}$, $$\frac{\partial (\Delta T_{OSC})}{\partial T_{OSC}} = 2 * \left( \frac{\partial \Delta V_{REF}}{\partial V_{REF}} + \frac{\partial \Delta I_{REF}}{\partial I_{REF}} + \frac{\partial \Delta tpd}{\partial tpd} \right)$$

Therefore, the worst-case frequency drift across temperature occurs at approximately at ±4% from 25 C.

Hence, there is a need in the art for solutions which will overcome the above-mentioned drawback(s), among others.

SUMMARY

An object of the embodiments herein is to disclose a circuit for performing exponential temperature compensation in an oscillator circuit, by reducing the frequency error in the oscillator across the temperature.

Another object of the embodiments herein is to disclose an error compensation circuit for eliminating temperature-based frequency error(s) in the oscillator.

Another object of the embodiments herein is to disclose methods and systems for providing a suitable temperature compensation circuit, to compensate exponential error(s) at higher temperature(s) of the comparator part of the circuit.

According to an embodiment of the disclosure, there is provided an error compensation circuit for eliminating temperature-based frequency error in an oscillator, including: a current limiting circuit including a first metal-oxide-semiconductor (MOS) device and a first resistive element connected to the first MOS device, the current limiting circuit configured to turn off the first MOS device to provide zero compensation current at a first temperature lower than a first reference value; a current generation circuit including a second MOS device, which is a source follower MOS device, and a second resistive element, which is a degeneration resistor, connected in series with the second MOS device, the current generation circuit configured to generate a compensation current at a second temperature higher than a second reference value; and a p-channel-metal-oxide-semiconductor (PMOS) current mirror configured to output the compensation current to a capacitor of the oscillator.

These and other aspects of the embodiments herein will be better appreciated and understood when considered in conjunction with the following description and the accompanying drawings. It should be understood, however, that the following descriptions, while indicating at least one embodiment and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF DRAWINGS

Embodiments herein are illustrated in the accompanying drawings, throughout which like reference letters indicate corresponding parts in the various figures. The embodiments herein will be better understood from the following description with reference to the following illustrative drawings. Embodiments herein are illustrated by way of examples in the accompanying drawings, and in which.

DETAILED DESCRIPTION

Figure 1:
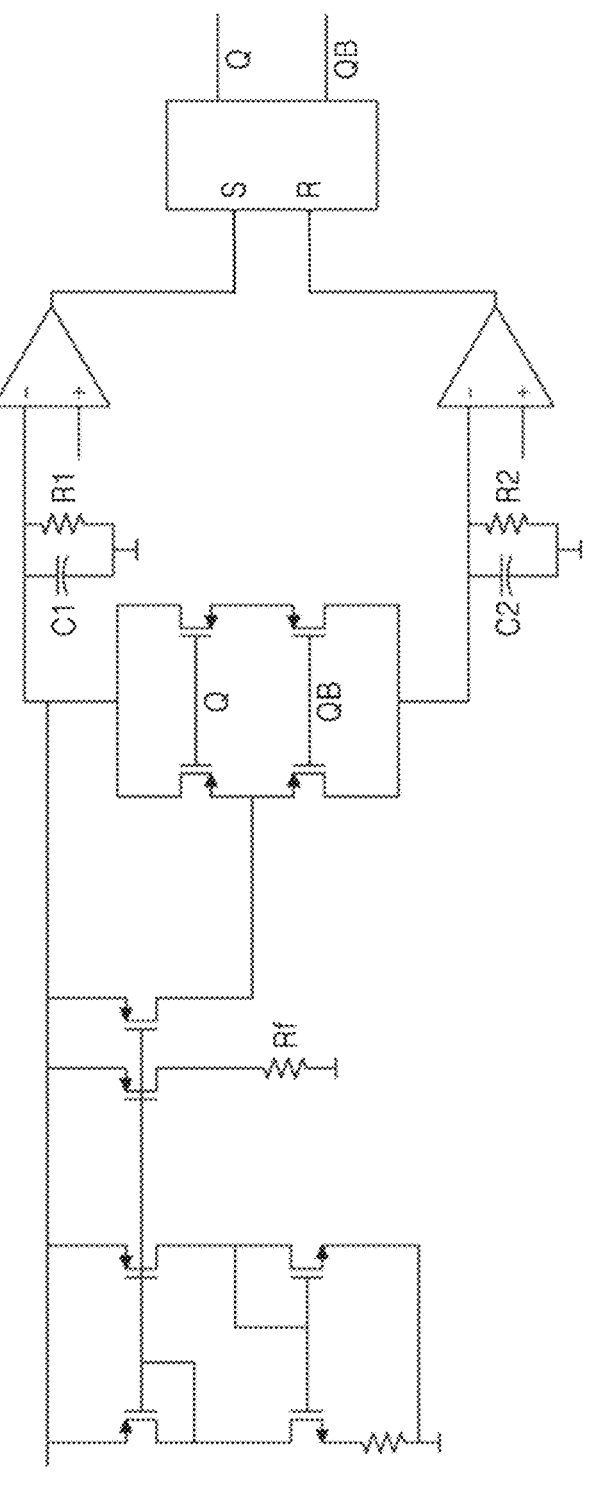
FIG. 1 is an example circuit diagram illustrating a resistance-capacitance (RC) relaxation oscillator, according to a related art.
Figure 2:
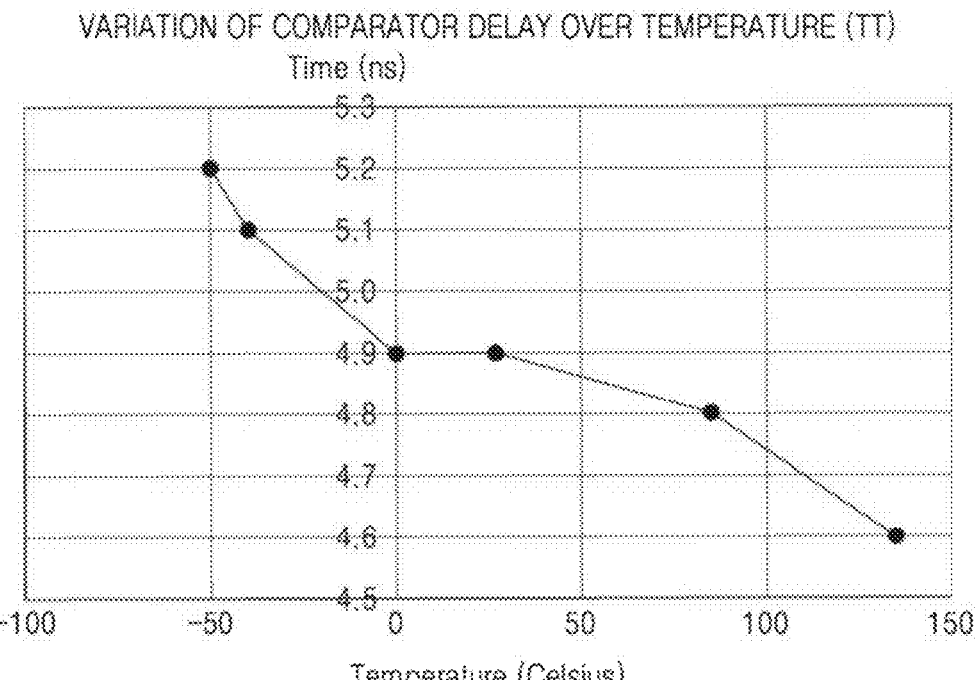
FIG. 2 is an example graph diagram illustrating the variation of a comparator delay over the temperature, according to a related art.
Figure 3:
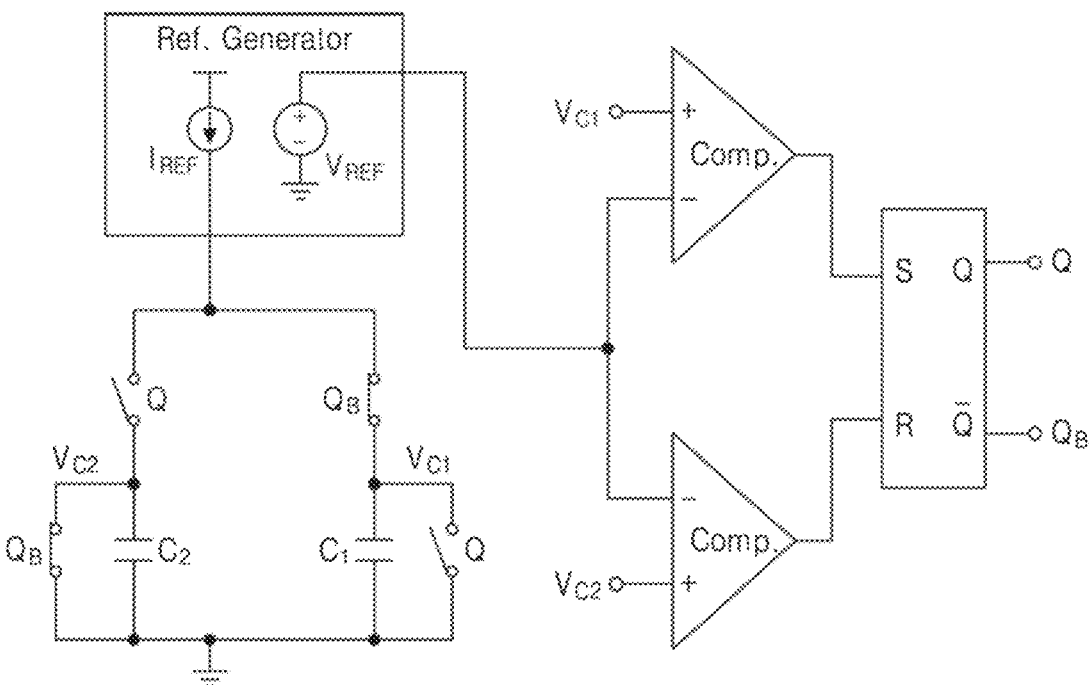
FIG. 3 is an example circuit diagram illustrating a reference voltage and a reference current for performing the operations of a comparator and biasing accordingly, according to a related art.
Figure 4:
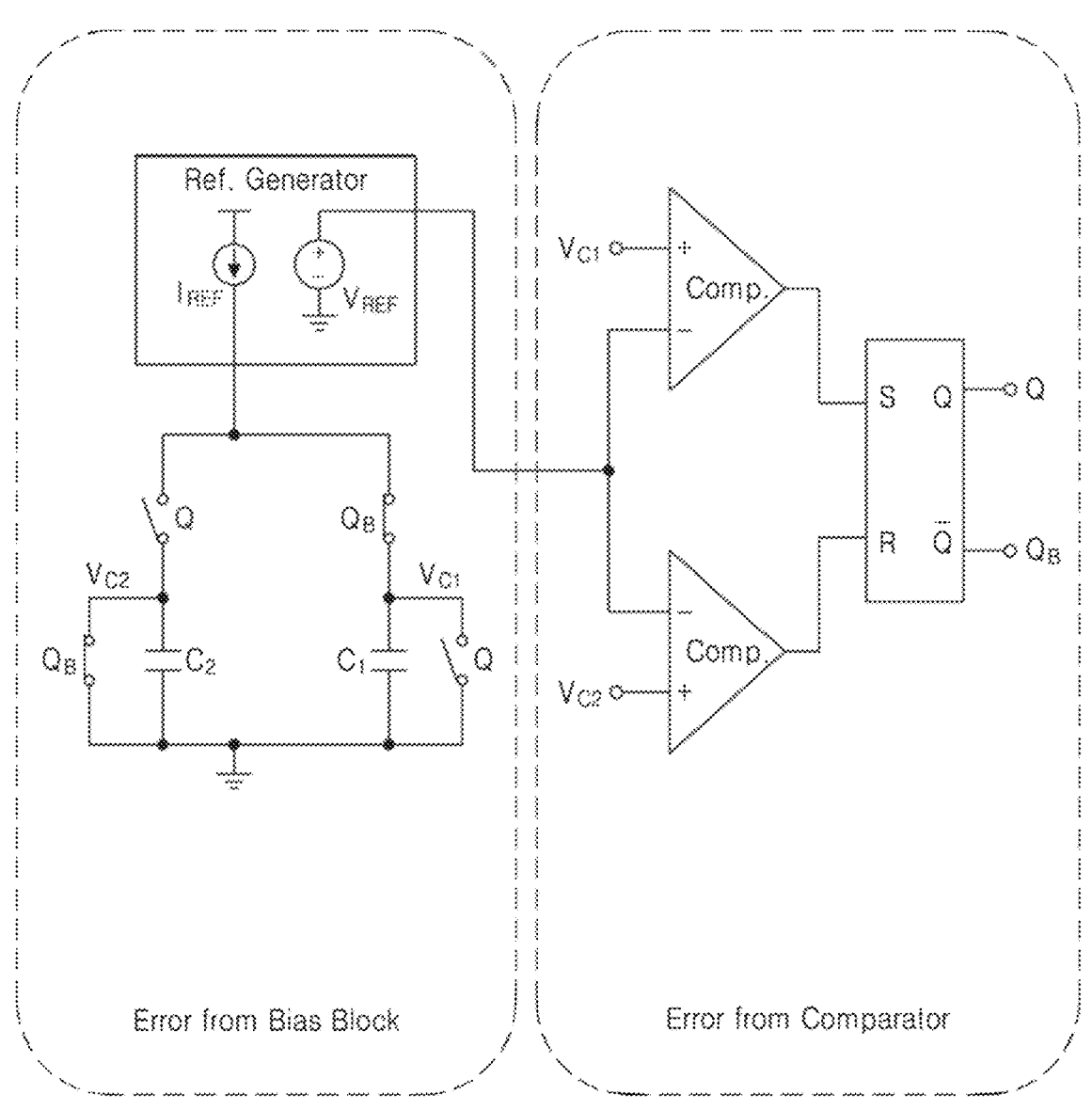
FIG. 4 is an example circuit diagram illustrating the occurrences of error from a bias block and a comparator, according to a related art.
Figure 5:
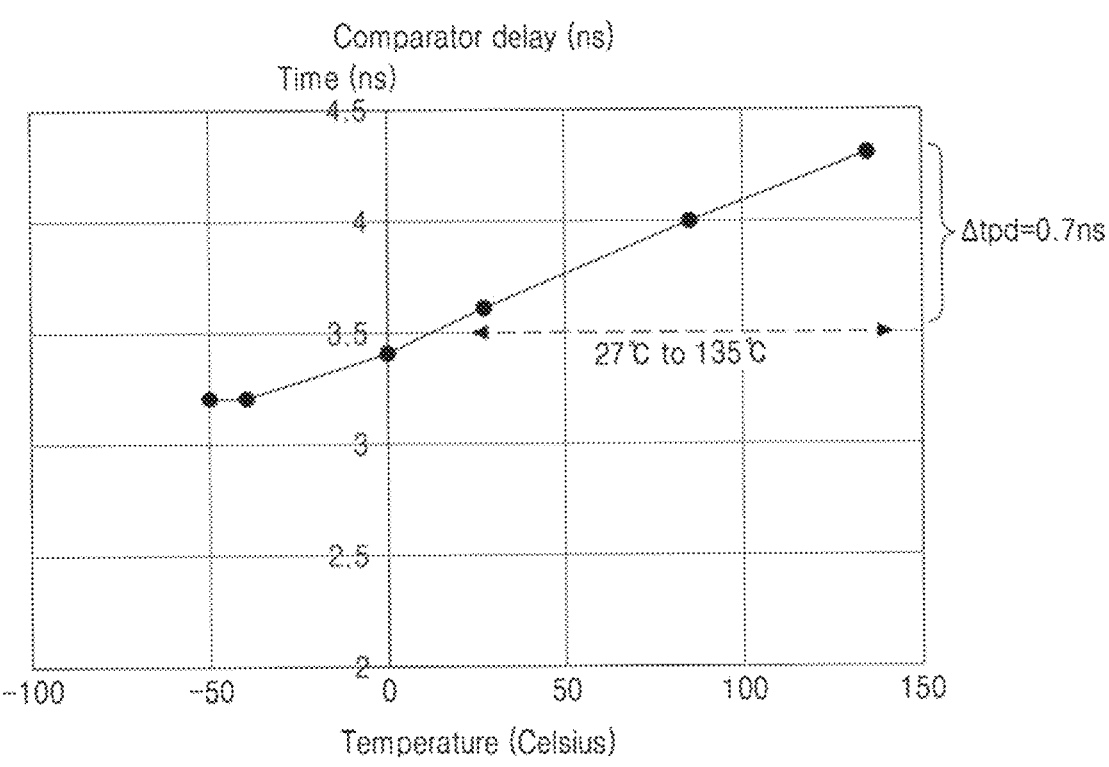
FIG. 5 is an example graph diagram illustrating a comparator delay with respect to the temperature for constant IBIAS, according to a related art.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein can be practiced and to further enable those of skill in the art to practice the embodiments herein. Accordingly, the examples should not be construed as limiting the scope of the embodiments herein.

For the purposes of interpreting this specification, the definitions (as defined herein) will apply and whenever appropriate the terms used in singular will also include the plural and vice versa. It is to be understood that the terminology used herein is for the purposes of describing particular embodiments only and is not intended to be limiting. The terms "comprising", "having" and "including" are to be construed as open-ended terms unless otherwise noted.

The words/phrases "exemplary", "example", "illustration", "in an instance", "and the like", "and so on", "etc.", "etcetera", "e.g.,", "i.e.," are merely used herein to mean "serving as an example, instance, or illustration." Any embodiment or implementation of the present subject matter described herein using the words/phrases "exemplary", "example", "illustration", "in an instance", "and the like", "and so on", "etc.", "etcetera", "e.g.,", "i.e.," is not necessarily to be construed as preferred or advantageous over other embodiments.

Embodiments herein may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by a firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

It should be noted that elements in the drawings are illustrated for the purposes of this description and ease of understanding and may not have necessarily been drawn to scale. For example, the flowcharts/sequence diagrams illustrate the method in terms of the steps required for understanding of aspects of the embodiments as disclosed herein.

Furthermore, in terms of the construction of the device, one or more components of the device may have been represented in the drawings by conventional symbols, and the drawings may show only those specific details that are pertinent to understanding the present embodiments so as not to obscure the drawings with details that will be readily apparent to those of ordinary skill in the art having the benefit of the description herein. Furthermore, in terms of the system, one or more components/modules which comprise the system may have been represented in the drawings by conventional symbols, and the drawings may show only those specific details that are pertinent to understanding the present embodiments so as not to obscure the drawings with details that will be readily apparent to those of ordinary skill in the art having the benefit of the description herein.

The accompanying drawings are used to help easily understand various technical features and it should be understood that the embodiments presented herein are not limited by the accompanying drawings. As such, the present disclosure should be construed to extend to any modifications, equivalents, and substitutes in addition to those which are particularly set out in the accompanying drawings and the corresponding description. Usage of words as first, such second, third etc., to describe components/elements/steps is for the purposes of this description and should not be construed as sequential ordering/placement/occurrence unless specified otherwise.

Embodiments herein disclose an error compensation circuit for eliminating temperature-based frequency error(s) in an oscillator. Referring now to the drawings, and more particularly to FIGS. 6 through 10, where similar reference characters denote corresponding features consistently throughout the figures, there are shown at least one embodiment.

Figure 6:
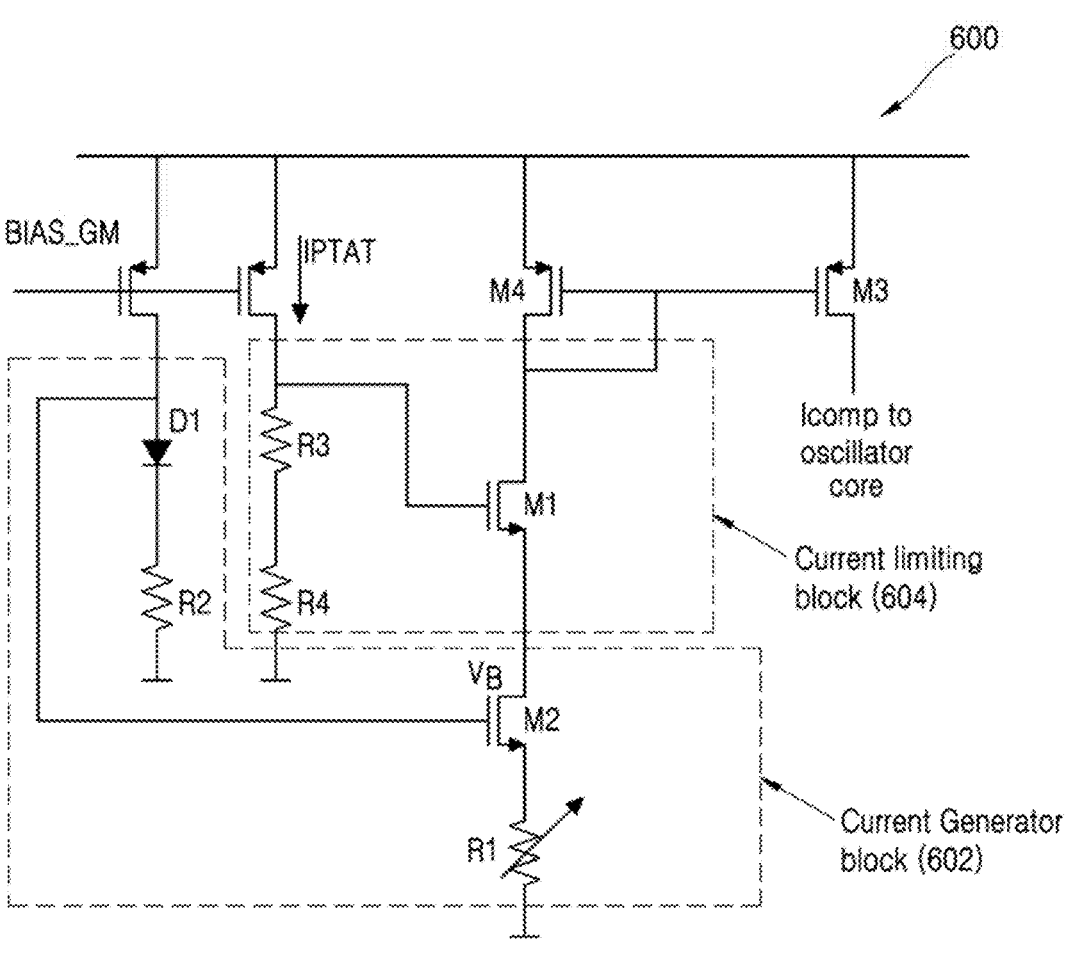
FIG. 6 is an example circuit diagram illustrating the error compensation for eliminating temperature-based frequency error in an oscillator, according to embodiments as disclosed herein.

FIG. 6 is an example circuit diagram illustrating the error compensation for eliminating temperature-based frequency error in an oscillator, according to embodiments as disclosed herein. Embodiments herein provide a circuit 600 for performing exponential temperature compensation in the oscillator by eliminating temperature-based frequency error(s) in the oscillator. The circuit 600 comprises a current generation block 602, and a current limiting block 604. The current generator block 602 comprises a second transistor M2, a first resistor R1, a second resistor R2, and a diode D1. The first resistor R1 may be a variable resistor. The current limiting block 604 comprises a first transistor M1, a third resistor R3 and a fourth resistor R4. However, the disclosure is not limited thereto, and as such, according to another embodiment, other components may be included in the current generator block 602 and/or the current limiting block 604.

As illustrated in the circuit 600, the current limiting block 604 can be configured with the first transistor M1 and the resistor network R3-R4 for providing zero compensation current at the lower temperature. Further, a gate of the first transistor M1 may be configured to receive a highly proportional-to-absolute-temperature (PTAT) voltage. Therefore, at lower temperatures, the gate of the first transistor M1 is not sufficient to turn on the first transistor M1, and as such the first transistor M1 remains turned off at the lower temperature ranges, and acts as a resistor at higher temperatures. In an embodiment as disclosed herein, lower temperature may be a temperature equal to or below a first reference value and higher temperature may be a temperature equal to or higher than a second reference value. According to an embodiment, the first reference value and the second reference value may be the same. In an embodiment as disclosed herein, the lower temperature may range from minus fifty (−50) degrees Celsius to twenty-five (25) degrees Celsius and the higher temperature ranges from eighty (80) degrees Celsius to hundred and thirty-five (135) degrees Celsius. However, the disclosure is not limited thereto, and as such, according to another embodiment, the lower temperature and the higher temperature may include other ranges.

As illustrated in FIG. 6, the second transistor M2, the first resistor R1, the second resistor R2, and the diode D1 of the current generator block 602 may control the exponential compensation current over the temperature. For example, the second transistor M2 may include a source follower MOS device and the variable resistor R1 may be a degeneration resistor. In an embodiment as disclosed herein, the source follower MOS device may be connected in series with the degeneration resistor for generating an exponential compensation current. A slightly proportional-to-absolute-temperature (PTAT) voltage or complementary-to-absolute-temperature (CTAT) voltage ($V_B$) is provided at a gate of the second transistor M2, and the second transistor M2 outputs a current of $I_{COMP}=(V_B-VGS_{M2})/R_1$. The $V_B$ is generated by a current from the gm bias network (BIAS_GM) connected to the diode D1 and the second R2. For example, the diode D1 and the second R2 generate the voltage $V_B$ based on the current from the gm bias network (BIAS_GM). In an embodiment as disclosed herein, the circuit 600 may include a current mirror for pushing the compensation current $I_{COMP}$ to a capacitor of the oscillator core. The current mirror may include a third transistor M3 and a fourth transistor M4. The third transistor M3 and the fourth transistor M4 may be a p-channel-metal-oxide-semiconductor (PMOS) transistor. However, the disclosure is not limited thereto, and as, according to another embodiment, the current mirror may be implemented in another manner.

As illustrated in FIG. 6, the $I_{COMP}$ compensates for the comparator delay variation, wherein $$I_{comp} = \frac{(V_B - VGS_{M2})}{R_1}, \text{ if } I_{PTAT} * (R_3 + R_4) > VTH_{M1}$$
$$\text{else, } 0.$$

In an embodiment as disclosed herein, the current limiting block 604 can comprise a metal-oxide-semiconductor (MOS) device and a resistor for ensuring zero compensation current at low temperatures by keeping the MOS device turned off. For example, the first transistor M1 may be an MOS transistor. However, the disclosure is not limited thereto, and as, according to another embedment, another type of switching component may be provided. According to an embodiment, the current generation block 602 comprises a source follower MOS device with a series connected degeneration resistor for generating an exponential compensation current, and a p-channel-metal-oxide-semiconductor (PMOS) current mirror for pushing the compensation current to a capacitor of the oscillator core.

In an embodiment as disclosed herein, at lower temperatures, the gate bias of the first transistor M1 may not be sufficient to turn on the first transistor M1. Accordingly, the current limiting block 604 does not allow current to flow through the first transistor M1 at lower temperatures. At higher temperatures, $I_{PTAT}*(R_3+R_4)$ becomes sufficient to turn on the first transistor M1 ON, and then the current $I_{COMP}$ starts to flow.

Figure 7A:
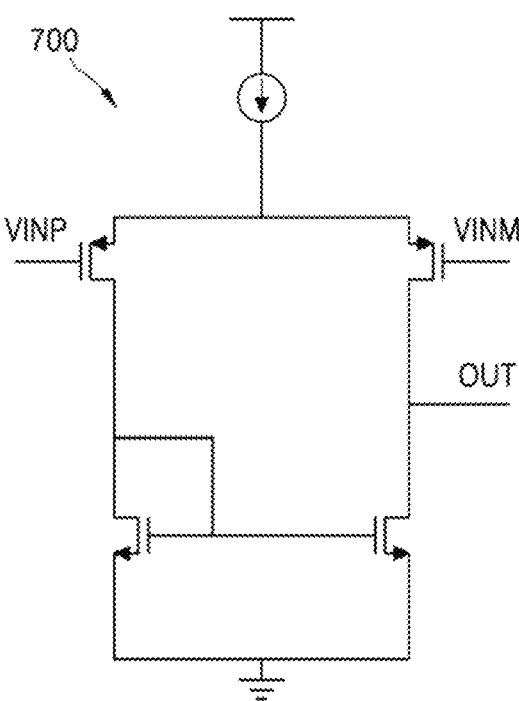
FIGS. 7A and 7B are example diagrams illustrating a comparator delay profile of the error compensation circuit, according to embodiments as disclosed herein.
Figure 7B:
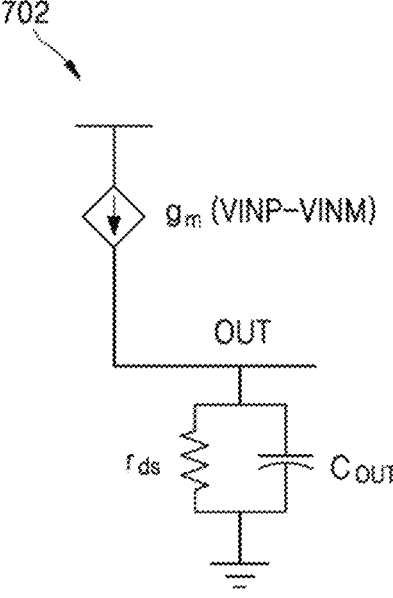

FIGS. 7A and 7B are example circuit diagrams illustrating a comparator delay profile of the error compensation circuit, according to embodiments as disclosed herein. FIG. 7A illustrates the single stage comparator 700, and FIG. 7B is its equivalent circuit 702 of the single stage comparator 700. As illustrated in FIGS. 7A and 7B, OUT=$g_m*$(VINP–VINM)*$(r_{ds}/1+sCr_{ds})$, OUT=$g_m$ (VINP–VINM)*$(1-e^{-t/T})*r_{ds}$ which gives, t∝$r_{ds}$. Here, $g_m$ is the transconductance. Also, the time constant of the circuit is dependent on $r_{ds}$ which in turn implies that the propagation delay reduces, as the current profile becomes more and more PTAT.

Figure 8:
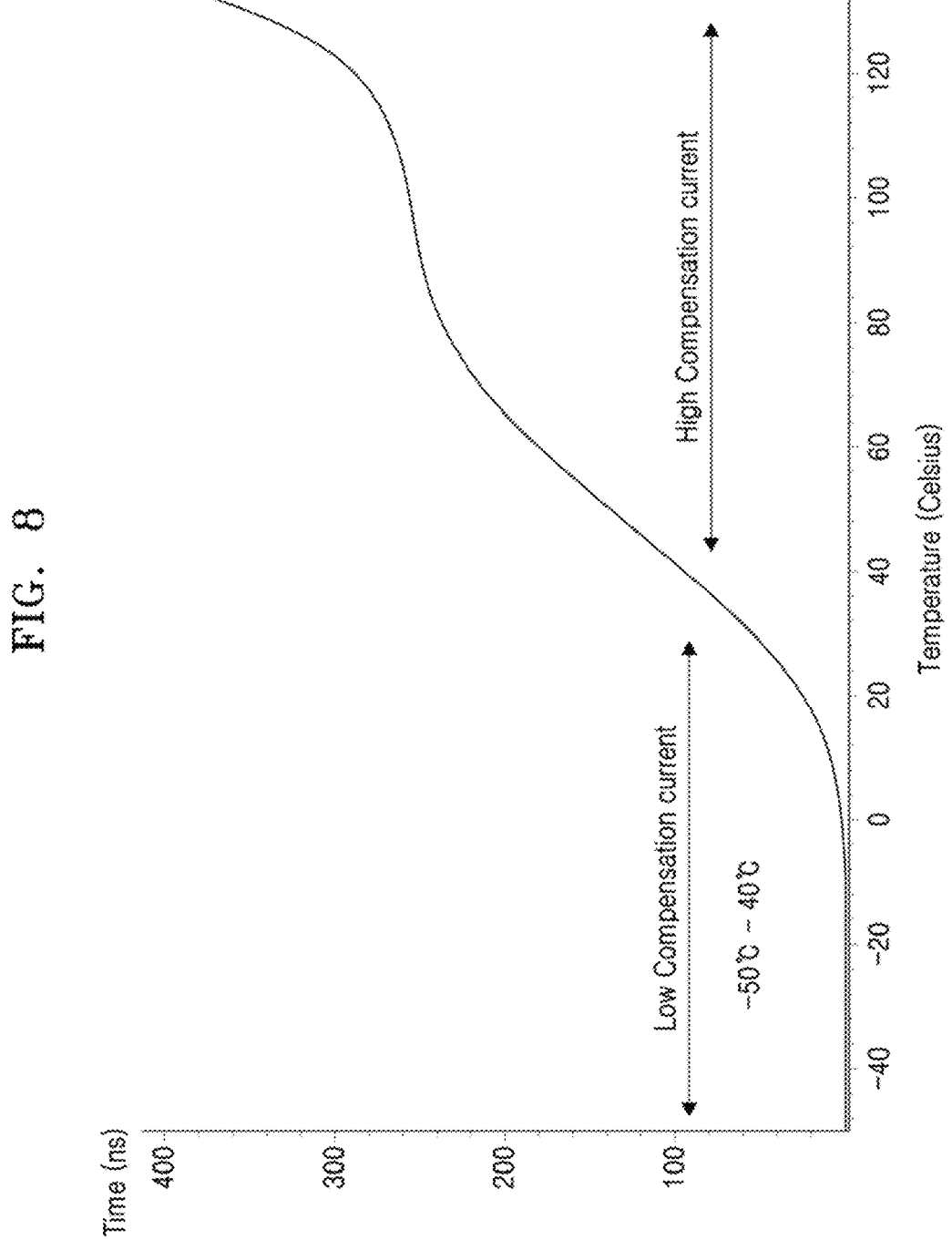
FIGS. 8 and 9 are example graph diagrams illustrating a compensation current profile and the comparator delay profile based on the temperature of the error compensation circuit, according to embodiments as disclosed herein.
Figure 9:
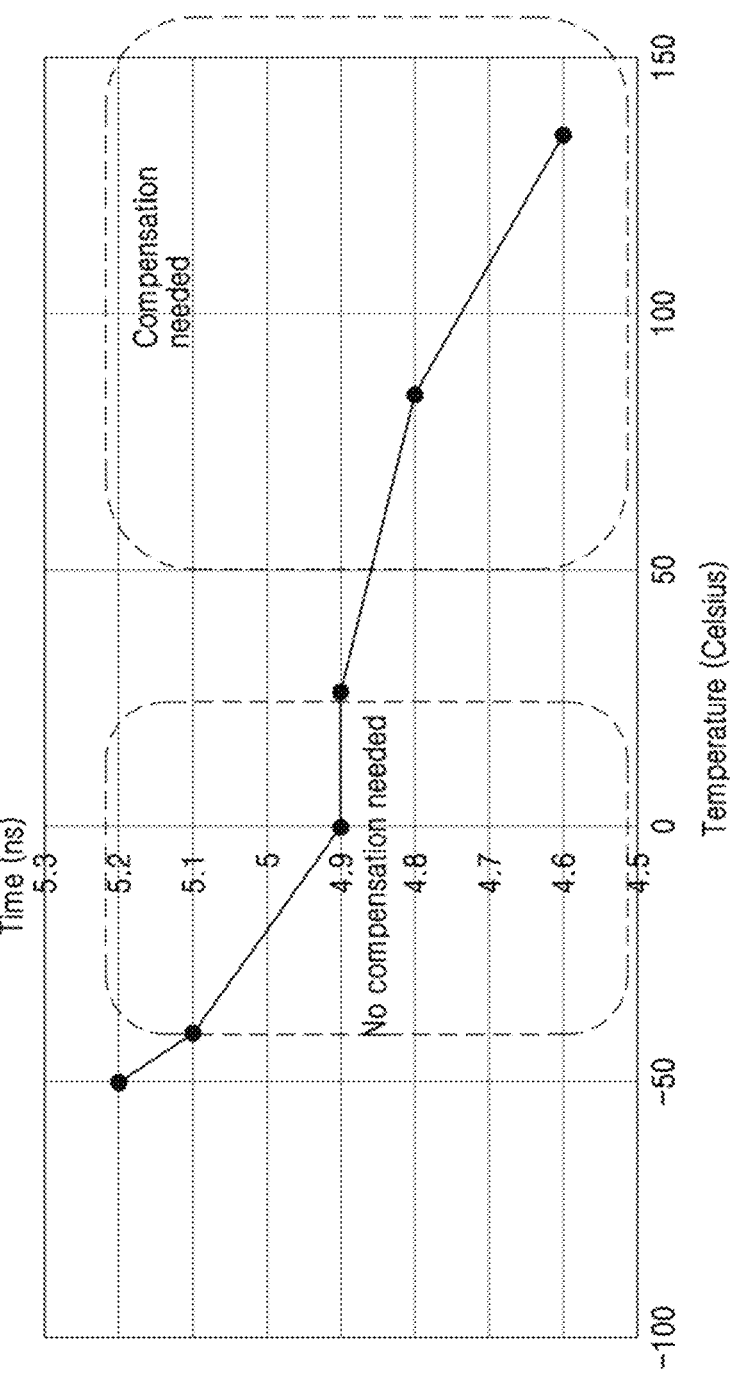

FIGS. 8 and 9 are example graph diagrams illustrating a compensation current profile and the comparator delay profile over the temperature of the error compensation circuit, according to embodiments as disclosed herein. As illustrated in FIG. 8, the compensation current can generate an exponential current output with respect to the temperature. At higher temperatures, a definite amount of current can be pushed into the capacitor of a RC relaxation oscillator.

Also, an error compensation circuit according to one or more embodiments disclosed herein can ensure the simple trimming, as frequency at lower temperatures is not affected by the addition of the compensation network. Therefore, correction is performed only at higher temperatures.

$$I_{Comp}=(V_{CTAT}-VGS_2)/R_1 \text{ at higher temperatures, otherwise 0.}$$

As illustrated in FIG. 8, the low compensation current is generated at lower temperatures and the high compensation current is generated at higher temperatures. FIG. 9 illustrates the comparator delay profile over the temperature, in which the compensation is not required at lower temperatures and as the temperature increases (i.e., at higher temperature) compensation is required.

Figure 10:
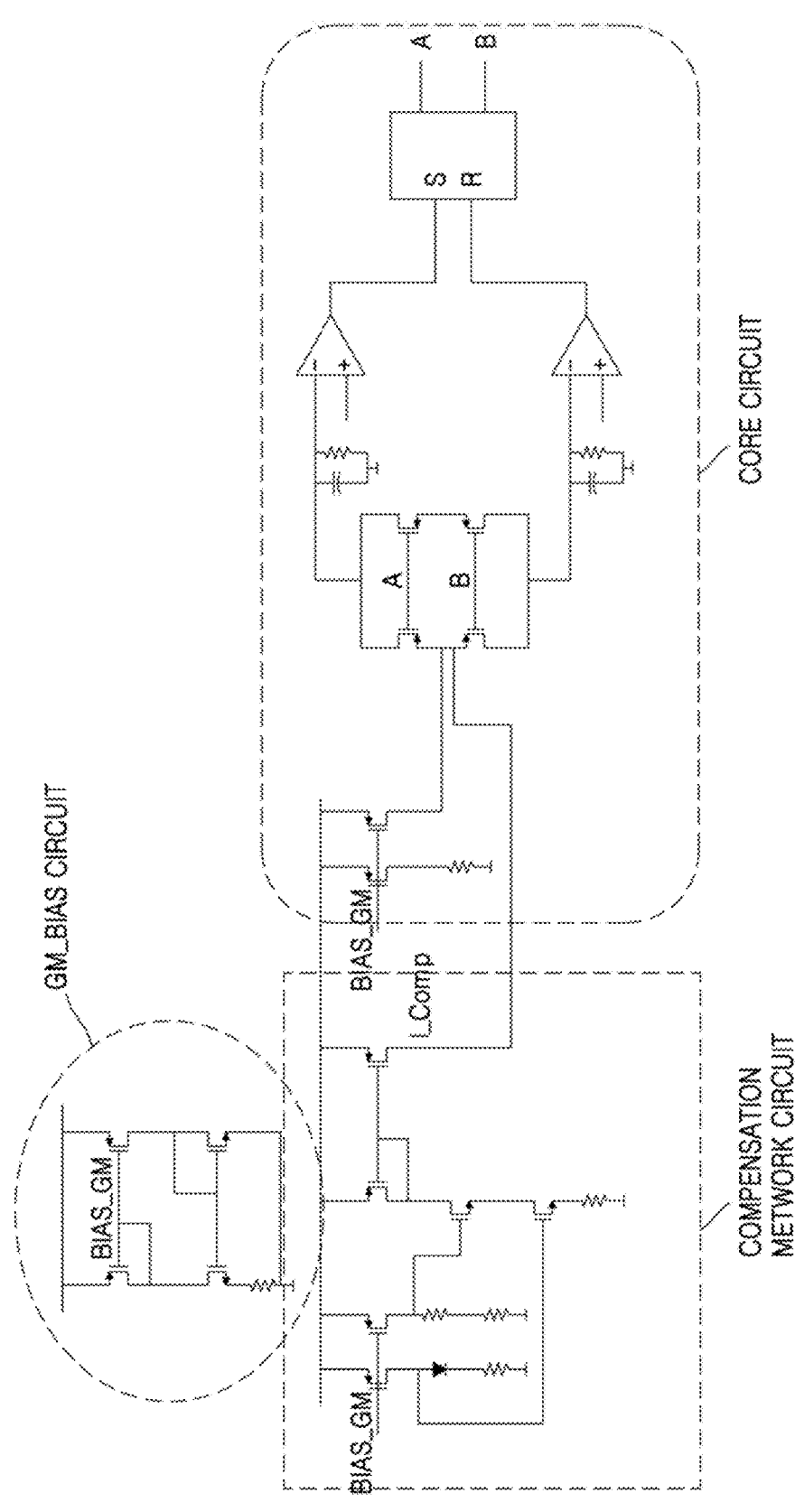
FIG. 10 is an example circuit diagram illustrating the resistance-capacitance (RC) relaxation oscillator with temperature compensation scheme, according to embodiments as disclosed herein.

FIG. 10 is an example circuit diagram illustrating the resistance-capacitance (RC) relaxation oscillator with temperature compensation scheme, according to embodiments as disclosed herein. As illustrated in FIG. 10, the RC relaxation oscillator with the temperature compensation circuit comprises a GM_BIAS circuit, a compensation network circuit and a core circuit. In an embodiment as disclosed herein, as shown in FIG. 10, a bias voltage may be provided from the compensation circuit to a gate of a transistor in the core circuit. The GM BIAS circuit applies a suitable bias to the compensation network circuit for providing a $I_{COMP}$ current to the core circuit. The bias (BIAS_GM) can be provided to a gate of a transistor at the GM BIAS circuit, the GM BIAS circuit applies a suitable bias to a gate of a transistor at the compensation network circuit for providing a $I_{COMP}$ current to the core circuit.

The embodiments disclosed herein can be implemented through at least one software program running on at least one hardware device and performing network management functions to control the network elements. The elements include blocks which can be at least one of a hardware device, or a combination of hardware device and software module.

The embodiment disclosed herein describes a circuit for performing exponential temperature compensation, by reducing the frequency error in the oscillator across the temperature. However, the disclosure is not limited thereto, and as such, according to another embodiment, there is provide a method for performing exponential temperature compensation, by reducing the frequency error in the oscillator across the temperature. According to another embodiment, there is provided a computer readable medium having stored thereon a program code means for implementation of one or more steps of the method, when the program runs on a server or mobile device or any suitable programmable device. The method is implemented in at least one embodiment through or together with a software program written in e.g., Very high-speed integrated circuit Hardware Description Language (VHDL) another programming language, or implemented by one or more VHDL or several software modules being executed on at least one hardware device. The hardware device can be any kind of portable device that can be programmed. The device may also include means which could be e.g., hardware means like e.g., an ASIC, or a combination of hardware and software means, e.g., an ASIC and an FPGA, or at least one microprocessor and at least one memory with software modules located therein. The method embodiments described herein could be implemented partly in hardware and partly in software. Alternatively, the invention may be implemented on different hardware devices, e.g., using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments and examples, those skilled in the art will recognize that the embodiments and examples disclosed herein can be practiced with modification within the scope of the embodiments as described herein.

What is claimed is:

1. An error compensation circuit for eliminating temperature-based frequency error in an oscillator, comprising:
a current limiting circuit comprising a first metal-oxide-semiconductor (MOS) device and a first resistive element connected to the first MOS device, the current limiting circuit configured to turn off the first MOS device to provide zero compensation current at a first temperature lower than a first reference value;
a current generation circuit comprising a second MOS device, which is a source follower MOS device, and a second resistive element, which is a degeneration resistor, connected in series with the second MOS device, the current generation circuit configured to generate a compensation current at a second temperature higher than a second reference value; and
a p-channel-metal-oxide-semiconductor (PMOS) current mirror configured to output the compensation current to a capacitor of the oscillator.

2. The error compensation circuit as claimed in claim 1, wherein the first MOS device comprises a first transistor, and the first resistive element comprises a first resistor and a second resistor.

3. The error compensation circuit as claimed in claim 2, wherein the current limiting circuit is configured to:
receive a highly proportional-to-absolute-temperature (PTAT) voltage at a gate of by the first transistor, and wherein the first transistor remains turned off at temperatures below the first reference value, and acts as a resistor at temperatures higher than the second reference value.

4. The error compensation circuit as claimed in claim 1, wherein the current generation circuit comprises a second transistor, a third resistor, a fourth resistor and a diode, and wherein the second resistive element is the third resistor and the second transistor is the second MOS device.

5. The error compensation circuit as claimed in claim 4, wherein a gate of the second transistor is configured to:

receive one of a slightly proportional-to-absolute-temperature (PTAT) voltage, and a complimentary to absolute temperature (CTAT) voltage, and output a compensation current $I_{comp}$ based on the one of the PTAT voltage and the CTAT voltage.

6. The error compensation circuit as claimed in claim 5, wherein the compensation current is generated for compensating a comparator delay variation based on the following equation:

$$I_{comp} = (V_B - VGS_{M2})/R_1,$$

wherein $I_{comp}$ is the compensation current, $V_B$ is one of the PTAT voltage and CTAT voltage, $VGS_{M2}$ is a gate voltage of the second transistor, and $R_1$ is a resistance value of the third resistor.

7. The error compensation circuit as claimed in claim 1, wherein the current generation circuit is configured to generate an exponential current output with respect to range of temperatures higher than the second reference value based on the compensation current.

8. The error compensation circuit as claimed in claim 1, wherein a predetermined current is output to the capacitor of the oscillator at the second temperature.

9. The error compensation circuit as claimed in claim 1, wherein the first reference value and the second reference value are same.

10. The error compensation circuit as claimed in claim 1, wherein the first reference value and the second reference value are different.

\* \* \* \* \*